(12) United States Patent
Vecchi et al.

(10) Patent No.: US 11,360,163 B2
(45) Date of Patent: Jun. 14, 2022

(54) VERTICAL HALL SENSOR STRUCTURE

(71) Applicant: TDK-Micronas GmbH, Freiburg (DE)

(72) Inventors: Maria-Cristina Vecchi, Freiburg (DE); Reinhard Erwe, Freiburg (DE); Martin Cornils, Freiburg (DE); Kerwin Khu, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 141 days.

(21) Appl. No.: 16/919,823

(22) Filed: Jul. 2, 2020

(65) Prior Publication Data

US 2021/0003641 A1 Jan. 7, 2021

(30) Foreign Application Priority Data

Jul. 4, 2019 (DE) ...................... 10 2019 004 599.8

(51) Int. Cl.
*G01R 33/07* (2006.01)
*H01L 43/04* (2006.01)
*H01L 43/06* (2006.01)

(52) U.S. Cl.
CPC ............ *G01R 33/077* (2013.01); *H01L 43/04* (2013.01); *H01L 43/065* (2013.01)

(58) Field of Classification Search
None
See application file for complete search history.

(56) References Cited

U.S. PATENT DOCUMENTS

| 4,700,211 | A | 10/1987 | Popovic et al. |
| 4,929,993 | A * | 5/1990 | Popovic ................ H01L 43/065 257/424 |
| 9,097,753 | B2 | 8/2015 | Raz et al. |
| 2005/0230770 | A1* | 10/2005 | Oohira ................. H01L 43/065 257/421 |
| 2007/0046287 | A1* | 3/2007 | Vervaeke ............... G01R 33/07 324/251 |
| 2009/0256559 | A1* | 10/2009 | Ausserlechner ..... G01R 33/075 257/E29.323 |
| 2015/0061069 | A1* | 3/2015 | Friedrich ............ H01L 27/0629 257/506 |

FOREIGN PATENT DOCUMENTS

DE   10 2011 107 767 A1   1/2013

* cited by examiner

*Primary Examiner* — Nasima Monsur
(74) *Attorney, Agent, or Firm* — Muncy, Geissler, Olds & Lowe, P.C.

(57) ABSTRACT

A vertical Hall sensor structure having a substrate layer, a semiconductor area of a first conductivity type, at least a first, a second and a third semiconductor contact area of the first conductivity type extending from an upper surface of the semiconductor area into the semiconductor area, and at least a first semiconductor contact area of a second conductivity type, wherein the semiconductor contact areas of the first conductivity type are spaced apart from each other and a metal connection contact layer is arranged on each semiconductor contact area of the first conductivity type. The first semiconductor contact area of the second conductivity type is adjacent to the first semiconductor contact area of the first conductivity type or is spaced at a distance of at most 0.2 μm from the first semiconductor contact area of the first conductivity type.

24 Claims, 5 Drawing Sheets

VERTICAL HALL SENSOR STRUCTURE

This nonprovisional application claims priority under 35 U.S.C. § 119(a) to German Patent Application No. 10 2019 004 599.8, which was filed in Germany on Jul. 4, 2019, and which is herein incorporated by reference.

BACKGROUND OF THE INVENTION

Field of the Invention

The present invention relates to a vertical Hall sensor structure.

Description of the Background Art

DE 10 2011 107 767 A1, which corresponds to U.S. Pat. No. 9,097,753, which is incorporated herein by reference, and which discloses a Hall sensor structure comprising a plurality of Hall sensor elements connected in series. Each Hall sensor element comprises three n-type semiconductor contact areas in an n-well area, wherein an insulation area, for example of a highly doped p$^+$ diffusion, is arranged between the n-type semiconductor contact areas.

SUMMARY OF THE INVENTION

It is therefore an object of the present invention to provide a device which further develops the prior art.

According to an exemplary embodiment of the invention, a vertical Hall sensor structure is provided, comprising a substrate layer with a semiconductor area formed on or in the substrate layer.

The semiconductor area has a first conductivity type and is electrically insulated from the substrate layer by means of a dielectric layer or by means of a p/n junction.

Furthermore, at least a first, a second and a third semiconductor contact area of the first conductivity type and at least a first semiconductor contact area of a second conductivity type is provided, extending in each case from the upper surface of the semiconductor area into the semiconductor area.

The semiconductor contact areas of the first conductivity type are spaced from another, respectively.

In each semiconductor contact area of the first conductivity type, a metallic connection contact layer is arranged.

Further, at least a first semiconductor contact area of a second conductivity type extending into the semiconductor area is provided, wherein the first semiconductor contact area of the second conductivity type is adjacent to the first semiconductor contact area of the first conductivity type or is spaced at a distance of at most 0.2 μm from the first semiconductor contact area of the first conductivity type.

The first semiconductor contact area of the first conductivity type is connected to the first semiconductor contact area of the second conductivity type in an electrically conductive manner.

The first conductivity type is n and the second conductivity type is p or the first conductivity type is p and the second conductivity type is n.

It should be noted that in the present invention, the expression "connected in an electrically conductive manner" can refer to an electrical short circuit between the semiconductor contact area of the first conductivity type and the semiconductor contact area of the second conductivity type.

When switching on the sensor, in particular with a low operating current of the Hall sensor, i.e., with currents in the range of 10 microamps to 100 mA, the temporary depletion of minorities is avoided.

Specifically, when the minorities have a high effective mass such as holes in an n-well, and thereby lower mobility than the majorities, the on-time can be substantially reduced by the present adjacent arrangement of semiconductor contact areas of different conductivity types.

An advantage is therefore that by means of the at least one semiconductor contact area of the second conductivity type at low currents, for example when switching on the sensor, minority carriers are provided as a result of which the transient characteristics of the Hall sensor improve. In particular immediately after startup, a drift of the measured values can be observed in a conventional Hall sensor due to a lack of minority carriers, before said measured values reach a stable reliable value after a few seconds. This drift is suppressed or avoided by the inventive design.

In other words, the inventive design of the semiconductor contact area of the second conductivity type can ensure the stability of the measured values immediately after startup.

A further advantage is found that a threshold voltage implantation in the area of the semiconductor area can be avoided and the startup behavior of low doped semiconductor areas in the range of less than $8 \cdot 10^{15}$ N/cm$^3$ can be improved, whereby high sensitivity of the Hall sensor structure is achieved. Thus, a highly sensitive Hall sensor with improved startup behavior is provided.

The first semiconductor contact area of the first conductivity type can have a first area and a second area, wherein the first semiconductor contact area of the second conductivity type is arranged between the first area and the second area, is adjacent to the first area and the second area or is spaced at a distance of at most 0.2 μm. The semiconductor contact area of the second conductivity type quasi divides the first semiconductor contact area of the first conductivity type and is short-circuited with this.

The Hall sensor structure can include a second semiconductor contact area of the second conductivity type, wherein said first semiconductor contact area of the second conductivity type is adjacent to a first side surface of the first semiconductor contact area of the first conductivity type or is spaced apart from the first side surface by at most 0.2 microns, and the second semiconductor contact area of the second conductivity type is adjacent to a second side surface of the first semiconductor contact area of the first conductivity type opposite the first side surface or is spaced apart from the second side surface by at most 0.2 μm. The two semiconductor contact areas of the second conductivity type thus virtually frame the first semiconductor contact area of the first conductivity type.

The semiconductor contact areas of the first conductivity type and the semiconductor contact areas of the second conductivity type can each have a rectangular upper surface.

The semiconductor contact areas of the first conductivity type can be arranged along a straight line, wherein the first semiconductor contact area of the first conductivity type is disposed along the straight line, centrally between the further semiconductor contact areas of the first conductivity type. A central arrangement of the first semiconductor contact area of the first conductivity type, ideally with the semiconductor contact area of the second conductivity type adjacent thereto, provides for a fast and at the same symmetrical additional delivery of minority charge carriers.

The Hall sensor structure can have at least one additional semiconductor contact area of the second conductivity type, wherein the additional semiconductor contact area of the second conductivity type extends along an edge of the upper surface of the semiconductor area from the upper surface into the semiconductor area and is in each case spaced at a distance from the semiconductor contact areas of the first conductivity type.

The additional semiconductor contact area of the second conductivity type can extend along at least 50% or along at least 75% or along at least 90% of a circumference of the semiconductor area or of an active area of the semiconductor area. For example, the additional semiconductor contact area of the second conductivity type completely surrounds an area including the semiconductor contact areas of the first conductivity type.

The additional semiconductor contact area of the second conductivity type can be clamped to a reference potential.

The Hall sensor structure can have a dielectric insulating layer, wherein the insulating layer comprises an oxide, covers the upper surface of the substrate layer and the upper surface of the semiconductor area, and the insulating layer has a thickness of at least 1 nm or a thickness in a range between 3 nm and 30 nm.

The semiconductor area can extend tub-shaped from an upper surface of the substrate layer into the substrate layer, wherein in a development, the Hall sensor structure has a polysilicon layer and the polysilicon layer covers a portion of an upper surface of the insulating layer and the polysilicon layer has a thickness of 0.1-0.8 microns or of 0.4-0.6 microns. In another development, the polysilicon layer is spaced at least 0.2 microns or at least 0.4 microns from each first semiconductor contact area.

The upper surface of the tub-shaped semiconductor area and the upper surface of the semiconductor contact areas coincide with the upper surface of the substrate layer and preferably form a flat plane.

The polysilicon layer forms the gate poly and is silicided in a further development in order to be able to produce a reliable electrical operative connection. The polysilicon layer is preferably clamped to a reference potential. Preferably, the reference potential is formed as ground potential.

In an example, in a boundary area between the substrate layer and the tub-shaped semiconductor area, an additional semiconductor contact area of the second conductivity type extends from the upper surface of the substrate layer and the upper surface of the semiconductor area into the substrate layer and the semiconductor area. The additional semiconductor contact area of the second conductivity type thus comprises a first area overlapping with the substrate layer and a second area overlapping with the semiconductor area.

The second area advantageously has a width of at least 0.05 microns or a width of 1-2 microns, since even a relatively small overlap with the semiconductor area is sufficient to ensure stable, time-independent operation of the Hall sensor structure immediately after startup.

The substrate can have a surface-wide oxide layer, for example, made of silicon, wherein the semiconductor area is integrally connected to an upper surface of the oxide layer.

The Hall sensor structure can include a trench extending at least from the upper surface of the semiconductor area to the surface-wide oxide layer.

The trench surrounds the semiconductor area. In this way, a semiconductor box is formed. The semiconductor contact areas of the first conductivity type as well as the at least one semiconductor contact area of the second conductivity type can each be disposed in the box area of the semiconductor area.

The trench can be filled with a polysilicon and/or side walls of the trench formed by the semiconductor area can be coated with a second dielectric layer and the second dielectric insulating layer has a thickness between 3 nm and 30 nm.

The substrate with the semiconductor area can form a so-called SOI structure. Here, the substrate layer and the semiconductor area are in each case formed of silicon and the oxide layer is formed as silicon dioxide.

The semiconductor area can be divided into individual sub-areas by means of circumferential trenches. By having the trenches reach from the surface of the semiconductor area up to the oxide layer, the individual sub-areas are electrically insulated from each other. The individual sub-areas can be described as box areas.

The oxide layer can be formed over the entire surface of the silicon wafer. In this way, the oxide layer is buried and also referred to as buried oxide.

Furthermore, the box area of the semiconductor area, which is surrounded by the trench, referred to as a trench or deep trench, can form the active area of the component. In other words, the trench insulates the active area, i.e., the box area, from the remaining semiconductor area, for example an adjacent active area.

The trenches can be filled with doped polysilicon, with the exception of the side walls. The doped polysilicon of the trenches is preferably connected to a reference potential, preferably to ground potential. This suppresses crosstalk between the box areas, particularly when the electrical potential between the boxes changes rapidly.

An advantage is that minority charge carriers are made available in the box area by means of the at least one semiconductor contact area of the second conductivity type.

An additional semiconductor contact area of the second conductivity type can extend along the trench, or at least along a portion of the trench, from an upper surface of the box area into the box area.

The semiconductor contact areas of the first conductivity type and/or the semiconductor contact areas of the second conductivity type can each have a dopant concentration of $5 \cdot 10^{18}$ N/cm$^3$ and/or the semiconductor area has a dopant concentration of $5 \cdot 10^{14}$-$5 \cdot 10^{16}$ N/cm$^3$.

Also, at least the areas of the semiconductor area extending between the semiconductor contact areas of the first conductivity type or the entire semiconductor area can be free of threshold voltage implantation.

The Hall sensor structure can be monolithic. For example, the semiconductor areas are made of silicon or comprise silicon. The Hall sensor structure can comprise at least a portion of a vertical Hall sensor.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
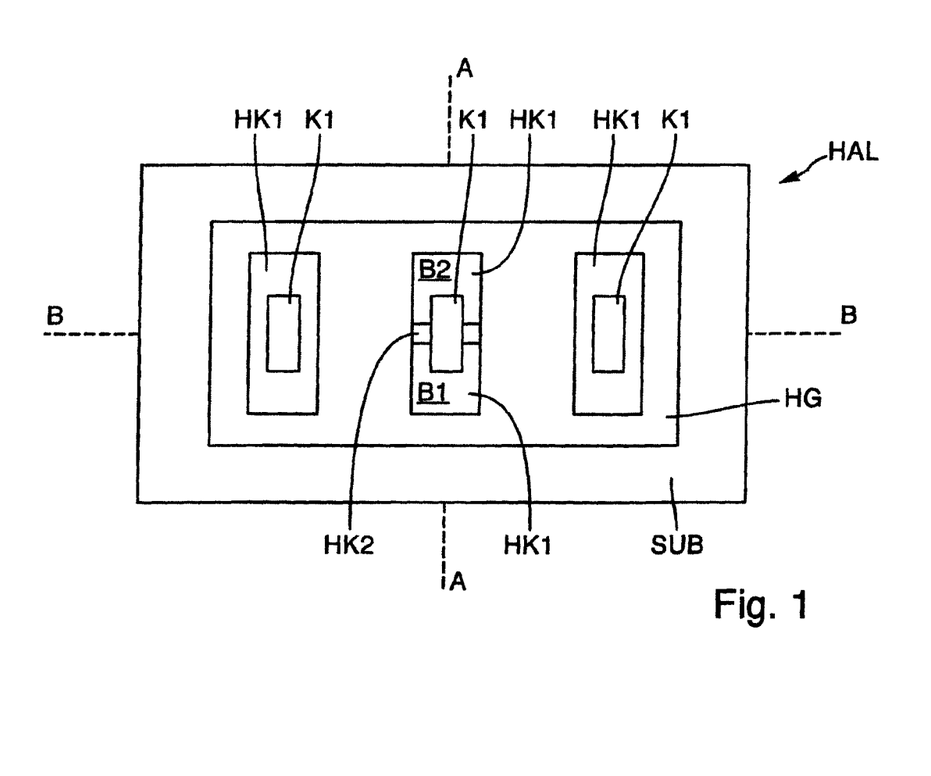
FIG. 1 is a plan view of an exemplary embodiment of a Hall sensor structure according to the invention.

The illustration in FIG. 1 shows a plan view of a first inventive embodiment of a Hall sensor structure HAL comprising a substrate layer SUB, and a semiconductor area HG of a first conductivity type and three semiconductor contact areas of the first conductivity type HK1 formed in the semiconductor area HG. The semiconductor area HG is rectangular. Here, the semiconductor area is embodied as an n-well in a p-substrate. The substrate consists of or comprises silicon.

The three semiconductor contact areas of the first conductivity type are in each case arranged spaced apart side by side, wherein the centrally disposed first semiconductor contact area of the first conductivity type HK1 comprises a first area B1 and a second area B2, and a first semiconductor contact area of a second conductivity type HK2 is arranged between the first area B1 and the second area B2.

The first semiconductor contact area of the second conductivity type HK2 is adjacent to both the first area B1 and the second area B2 of the first semiconductor contact area of the first conductivity type HK1.

In each semiconductor contact area of the first conductivity type HK1, in each case a metallic connection contact layer K1 is arranged, wherein the connection contact layer K1 disposed on said first semiconductor contact area of the first conductivity type HK1 extends over a first area B1, the first semiconductor contact area of the second conductivity type HK2 and the second area B2, such that the first semiconductor contact area of the second conductivity type HK2 is electrically conductively connected to the first semiconductor contact area of the first conductivity type HK1.

Figure 2:
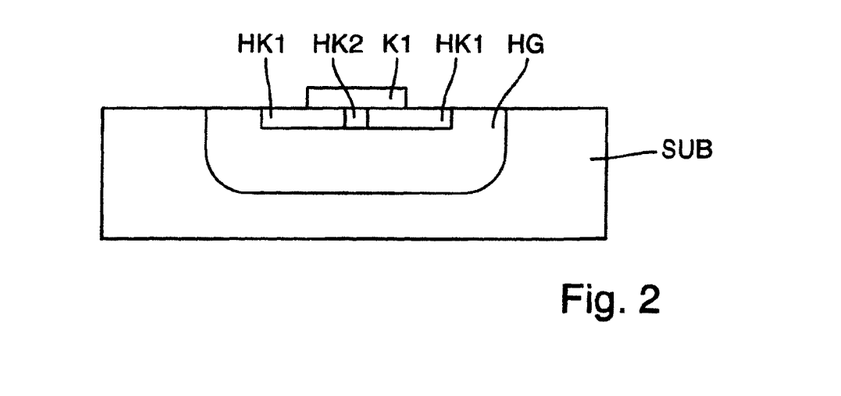
FIG. 2 is a cross section of an exemplary embodiment of the Hall sensor structure according to the invention.

FIG. 2 shows a cross section along the line A-A of FIG. 1. In the following, only the differences from the illustration in FIG. 1 are explained.

The semiconductor area HG extends tub-shaped from an upper surface of the substrate layer SUB into the substrate layer SUB. Furthermore, the semiconductor contact areas of the first conductivity type HK1 and the first semiconductor contact area of the second conductivity type HK2 respectively reach in each case from an upper surface into the semiconductor area HG.

Figure 3:
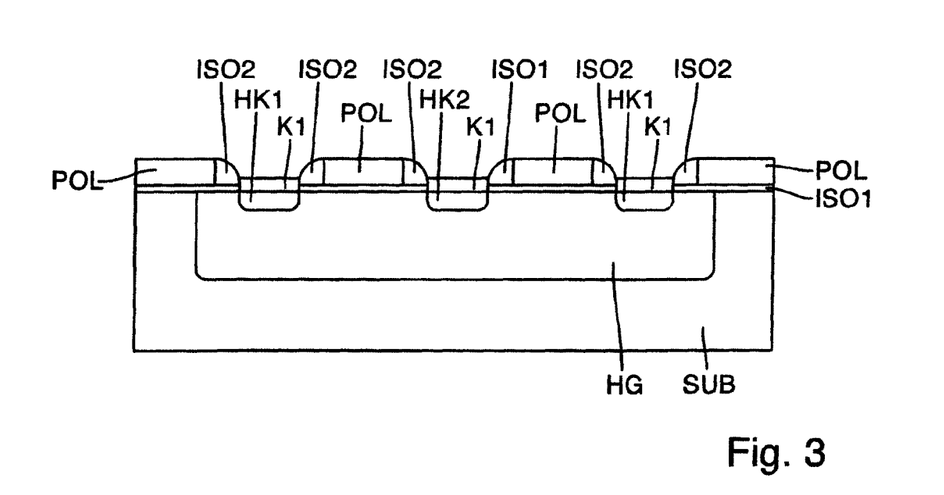
FIG. 3 is a cross section of an exemplary embodiment of the Hall sensor structure according to the invention.

In the illustration of FIG. 3, a cross section corresponding to a section along the line B-B of FIG. 1 is shown. Only the differences from the illustrations in FIGS. 1 and 2 are explained below.

The metallic connection contact layers K1 are each formed flat on the semiconductor contact layers of the first conductivity type HK1 and the first semiconductor contact area of the second conductivity type HK2.

The upper surface of the substrate layer SUB and the upper surface of the semiconductor area HG are each coated with a first dielectric insulating layer ISO1.

On an upper surface of the first insulating layer ISO1 is a polysilicon layer POL, wherein said polysilicon layer is in each case spaced apart from the semiconductor contact areas of the first conductivity type HK1 and the first semiconductor contact area of the second conductivity type HK2, and the distance is filled with a second insulating layer ISO2.

Figure 4:
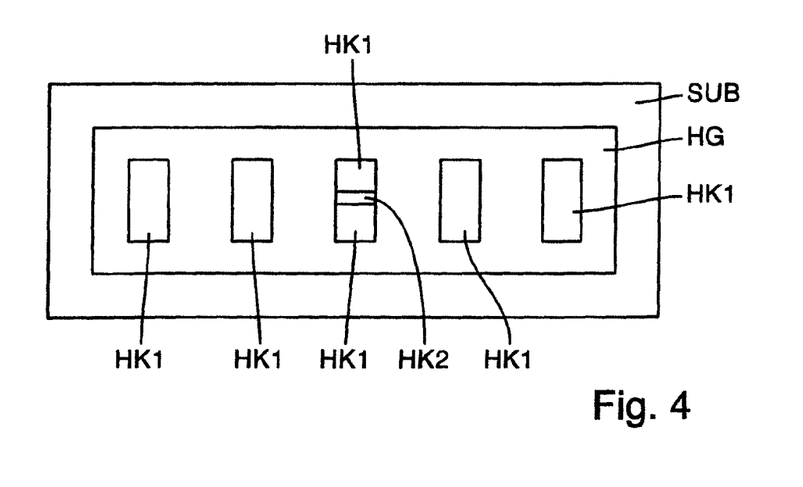
FIG. 4 is a plan view of an exemplary embodiment of the Hall sensor structure according to the invention.

The illustration of FIG. 4 shows a plan view of a further embodiment of the Hall sensor structure HAL. Only the differences from the illustration in FIG. 1 are explained below.

The Hall sensor structure HAL has five semiconductor contact areas of the first conductivity type HK1, wherein the first semiconductor contact area of the first conductivity type HK1 is again arranged centrally with the adjacent first semiconductor contact area of the second conductivity type HK2.

Figure 5:
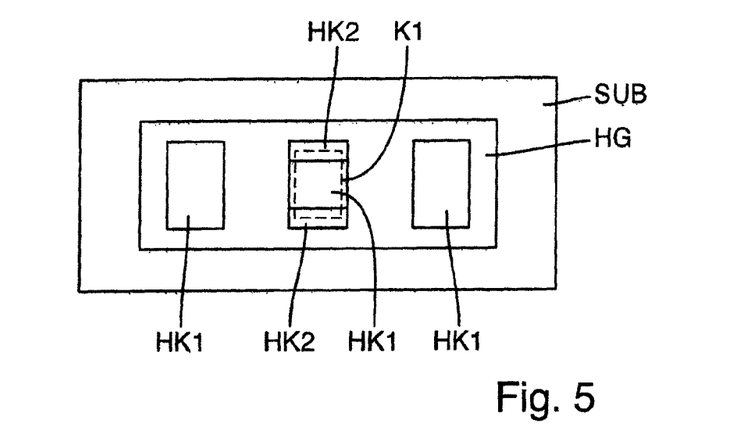
FIG. 5 is a plan view of an exemplary embodiment of the Hall sensor structure according to the invention.

FIG. 5 shows a plan view of a further embodiment of the Hall sensor structure HAL. Only the differences from the illustration in FIG. 1 are explained below.

The Hall sensor structure HAL has two semiconductor contact areas of the second conductivity type HK2, wherein the two semiconductor contact areas of the second conductivity type are adjacently arranged on two opposite sides of the centrally arranged first semiconductor contact area of the first conductivity type HK1.

The metallic connection contact layer disposed on the first semiconductor contact area of the first conductivity type HK1 also extends over the two adjacent semiconductor contact areas of the second conductivity type HK2.

Figure 6:
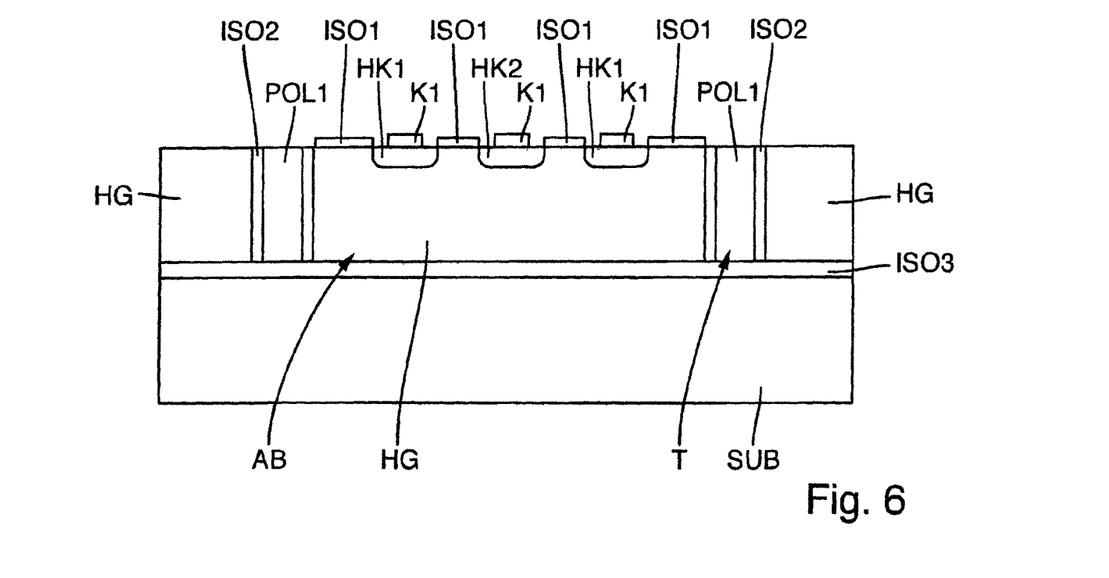
FIG. 6 is a cross section of an exemplary embodiment of the Hall sensor structure according to the invention.
Figure 7:
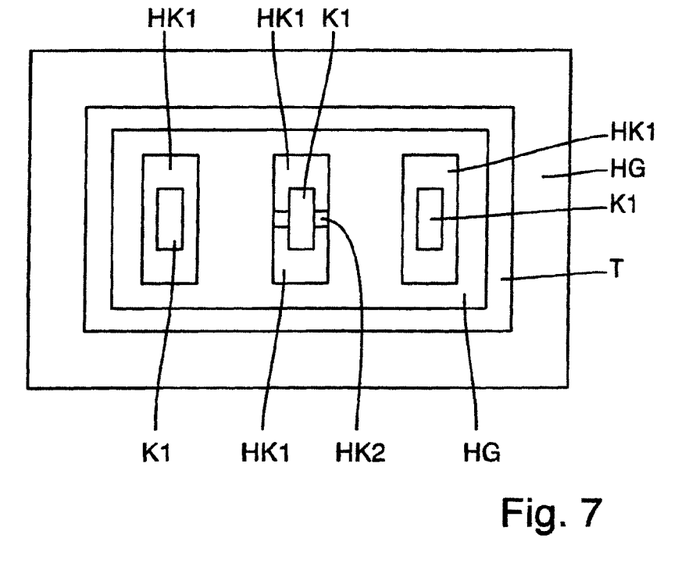
FIG. 7 is a plan view of an exemplary embodiment of the Hall sensor structure according to the invention.

The illustrations of FIGS. 6 and 7 show a cross section and a plan view of another embodiment of the Hall sensor structure HAL. Only the differences from the illustrations in the previous figures are explained below.

The substrate layer SUB comprises an oxide layer ISO3 formed on an upper surface of the substrate layer SUB. The semiconductor area HG is integrally connected to an upper surface of the oxide layer ISO 3, wherein a trench T extending from an upper surface of the semiconductor area HG up to the oxide layer ISO3 encloses a box area AB of the semiconductor area HG.

A side wall of the trench T is coated with a dielectric insulating layer ISO2, and the trench T is also filled with a polysilicon POL1.

The three semiconductor contact areas of the first conductivity type HK1 and the at least one semiconductor contact area of the second conductivity type extend from an upper surface of the box area AB into the box area AB of the semiconductor area HG. The upper surface of the box area AB is coated with a dielectric insulating layer ISO1.

Figure 8:
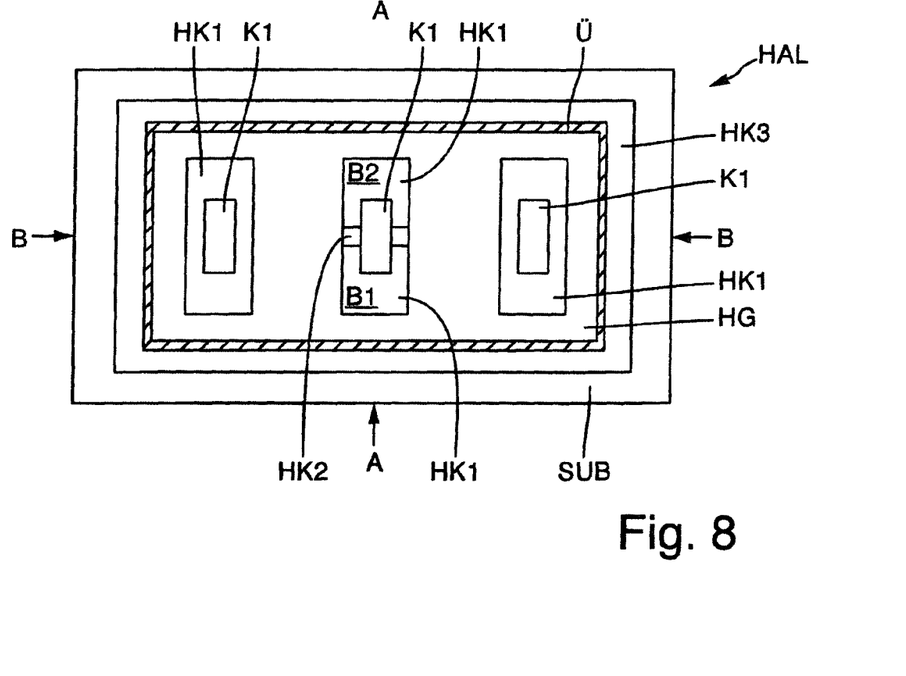
FIG. 8 is a cross section of an exemplary embodiment of the Hall sensor structure according to the invention.
Figure 9:
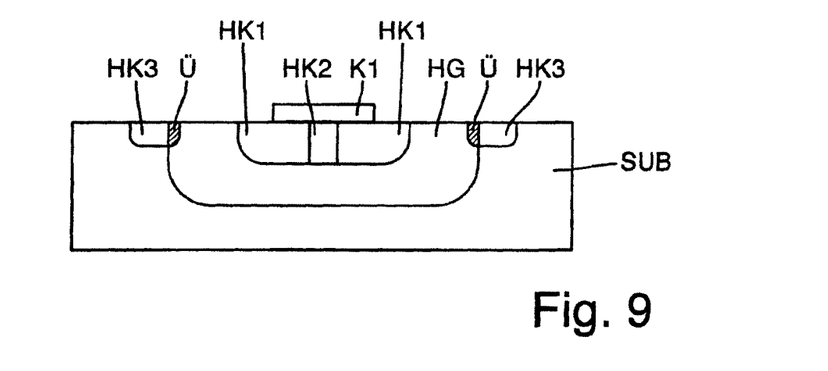
FIG. 9 is a plan view of an exemplary embodiment of the Hall sensor structure according to the invention.

The illustrations of FIGS. 8 and 9 show a cross section and a plan view of another embodiment of the Hall sensor structure HAL. Only the differences from the illustrations in FIGS. 1 and 2 are explained below.

The Hall sensor structure HAL has another semiconductor contact area of the second conductivity type HK3, wherein the further semiconductor contact area HK3 encloses the tub-shaped semiconductor area HG or extends along a boundary between a side wall of the tub-shaped semiconductor area HG and the substrate layer SUB, from the upper surface of the substrate layer and the upper surface of the semiconductor area HG into the substrate layer SUB and the semiconductor area HG, such that in particular an overlapping region U is created with the semiconductor area HG. In addition, the further semiconductor contact area of the second conductivity type HK3 is spaced apart from all semiconductor contact areas of the first conductivity type.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vertical Hall sensor structure comprising:
   a substrate layer;
   a semiconductor area of a first conductivity type extends tub-shaped from an upper surface of the substrate layer into the substrate layer, the semiconductor area being electrically insulated from the substrate layer by a dielectric layer or by a p/n junction;
   at least a first, a second and a third semiconductor contact area of the first conductivity type extending from an upper surface of the semiconductor area into the semiconductor area, wherein the first, second and third semiconductor contact areas are surrounded by the semiconductor area, the first, second and third semiconductor contact areas of the first conductivity type being spaced apart from each other;
   a metallic contact layer connection arranged on the first, second, and third semiconductor contact area of the first conductivity type; and
   at least a first semiconductor contact area of a second conductivity type extending into the semiconductor area,
   wherein the first semiconductor contact area of the second conductivity type is adjacent to the first semiconductor contact area of the first conductivity type or is spaced at a distance of at most 0.2 microns from the first semiconductor contact area of the first conductivity type,
   wherein the first semiconductor contact area of the first conductivity type is electrically connected to the first semiconductor contact area of the second conductivity type, and
   wherein the first conductivity type is different from the second conductivity type.

2. The vertical Hall sensor structure according to claim 1, wherein the first semiconductor contact area of the first conductivity type comprises a first area and a second area, wherein the first semiconductor contact area of the second conductivity type is arranged between the first area and the second area, is adjacent to the first area and the second area, or is spaced at a distance of at most 0.2 microns.

3. The vertical Hall sensor structure according to claim 1, wherein the Hall sensor structure comprises a second semiconductor contact area of the second conductivity type, wherein the first semiconductor contact area of the second conductivity type is adjacent to a first side surface of the first semiconductor contact area of the first conductivity type or is spaced at a distance of at most 0.2 microns from the first side surface, and wherein the second semiconductor contact area of the second conductivity type is adjacent to a second side surface of the first semiconductor contact area of the first conductivity type opposite the first side surface or is spaced at a distance of at most 0.2 microns from the second side surface.

4. The vertical Hall sensor structure according to claim 1, wherein the first, second, and third semiconductor contact areas of the first conductivity type and the first semiconductor contact area of the second conductivity type each have a rectangular upper surface.

5. The vertical Hall sensor structure according to claim 1, wherein the first, second, and third semiconductor contact areas of the first conductivity type are arranged along a straight line, wherein the first semiconductor contact area of the first conductivity type is arranged along the straight line centrally between the second and third semiconductor contact areas of the first conductivity type.

6. The vertical Hall sensor structure according to claim 1, wherein the Hall sensor structure comprises at least one additional semiconductor contact area of the second conductivity type, wherein the additional semiconductor contact area of the second conductivity type extends along an edge of the upper surface of the semiconductor area from the upper surface into the semiconductor area and is spaced at a distance from the first, second, and third semiconductor contact areas of the first conductivity type.

7. The vertical Hall sensor structure according to claim 6, wherein the additional semiconductor contact area of the second conductivity type is clamped to a reference potential.

8. The vertical Hall sensor structure according to claim 1, wherein the Hall sensor structure comprises a dielectric insulating layer, wherein the insulating layer comprises an oxide, covers the upper surface of the substrate layer and the upper surface of the semiconductor area, and wherein the insulating layer has a thickness of at least 1 nm or a thickness in a range between 3 nm and 30 nm.

9. The vertical Hall sensor structure according to claim 1, wherein the semiconductor area extends tub-shaped from an upper surface of the substrate layer into the substrate layer.

10. The vertical Hall sensor structure according to claim 8, wherein the Hall sensor structure comprises a polysilicon layer, wherein the polysilicon layer covers a portion of an upper surface of the insulating layer, and wherein the polysilicon layer has a thickness of 0.1 - 0.8 microns or 0.4 - 0.6 microns.

11. The vertical Hall sensor structure according to claim 10, wherein the polysilicon layer is spaced at a distance of at least 0.2 microns or of at least 0.4 microns from the first, second, and third semiconductor contact areas of the first conductivity type.

12. The vertical Hall sensor structure according to claim 1, wherein the substrate layer comprises an oxide layer, wherein the semiconductor area is integrally connected to an upper surface of the oxide layer, wherein the Hall sensor structure comprises at least one trench extending from the upper surface of the semiconductor area to the oxide layer, wherein the at least one trench encloses a box area of the semiconductor area, and wherein the semiconductor contact areas of the first conductivity type and the first semiconductor contact area of the second conductivity type are disposed in the box area of the semiconductor area.

13. The vertical Hall sensor structure according to claim 12, wherein the trench is filled with a polysilicon.

14. The vertical Hall sensor structure according to claim 12, wherein side walls of the trench formed by the semiconductor area are coated with a second dielectric insulating layer, and wherein the second dielectric insulating layer has a thickness between 3 nm and 30 nm.

15. The vertical Hall sensor structure according to claim 1, wherein the first conductivity type is n and the second conductivity type is p or wherein the first conductivity type is p and the second conductivity type is n.

16. The vertical Hall sensor structure according to claim 1, wherein the first, second, and third semiconductor contact areas of the first conductivity type and/or the first semiconductor contact area of the second conductivity type each have a dopant concentration of $5 \cdot 10^{18}$ N/cm$^3$.

17. The vertical Hall sensor structure according to claim 1, wherein the semiconductor area has a dopant concentration of $5 \cdot 10^{14}$–$5 \cdot 10^{16}$ N/cm$^3$.

18. The vertical Hall sensor structure according to claim 1, wherein at least the areas of the semiconductor area extending between the first, second, and third semiconductor contact areas of the first conductivity type or the entire semiconductor area are free of threshold voltage implantation.

19. The vertical Hall sensor structure according to claim 1, wherein the Hall sensor structure is monolithic.

20. The vertical Hall sensor structure according to claim 1, wherein the Hall sensor structure comprises at least a portion of a vertical Hall sensor.

21. The vertical Hall sensor structure according to claim 1, wherein the semiconductor area comprises a n-well extending into the substrate.

22. The vertical Hall sensor structure according to claim 21, wherein the first, second and third semiconductor contact areas of the first conductivity type are disposed within the n-well.

23. The vertical Hall sensor structure according to claim 1, wherein a central contact area of the first, second and third semiconductor contact areas of the first conductivity type has a first area and a second area and the first semiconductor contact area of the second conductivity type is arranged within the central contact area of the three semiconductor areas between the first area and the second area.

24. A vertical Hall sensor structure comprising:
a substrate layer;
a semiconductor area of a first conductivity type extends tub-shaped from an upper surface of the substrate layer into the substrate layer, the semiconductor area being electrically insulated from the substrate layer by a dielectric layer or by a p/n junction;
three semiconductor contact areas of the first conductivity type each extending from an upper surface of the semiconductor area into the semiconductor area, wherein the three semiconductor contact areas are surrounded by the semiconductor area, and being spaced apart from each other, a central one of the three semiconductor areas of the first conductivity type having a first area and a second area;
a metallic contact layer connection arranged on each of the three semiconductor contact areas of the first conductivity type; and
a first semiconductor contact area of a second conductivity type arranged within the central one of the three semiconductor areas between the first area and the second area,
wherein the first conductivity type is different from the second conductivity type.

* * * * *